(12) United States Patent
Sewak

(10) Patent No.: US 9,904,744 B2
(45) Date of Patent: Feb. 27, 2018

(54) PROBABILISTIC SIMULATION SCENARIO DESIGN BY USING MULTIPLE CONDITIONAL AND NESTED PROBABILITY DISTRIBUTION INPUT FUNCTIONS

(71) Applicant: International Business Machines Corporation, Armonk, NY (US)

(72) Inventor: Mohit Sewak, Lucknow (IN)

(73) Assignee: International Business Machines Corporation, Armonk, NY (US)

( * ) Notice: Subject to any disclaimer, the term of this patent is extended or adjusted under 35 U.S.C. 154(b) by 628 days.

(21) Appl. No.: 14/493,841

(22) Filed: Sep. 23, 2014

(65) Prior Publication Data

US 2016/0085889 A1    Mar. 24, 2016

(51) Int. Cl.
G06F 17/50 (2006.01)

(52) U.S. Cl.
CPC .................. G06F 17/5009 (2013.01)

(58) Field of Classification Search
CPC .................................................. G06F 17/5018
USPC ............................................................ 703/2
See application file for complete search history.

(56) References Cited

U.S. PATENT DOCUMENTS

| | | | |
|---|---|---|---|
| 7,739,085 B2 * | 6/2010 | Gottsman | G06F 17/5009 703/6 |
| 8,311,773 B2 | 11/2012 | Spiesberger | |
| 8,392,165 B2 | 3/2013 | Craig et al. | |
| 8,396,204 B2 | 3/2013 | Guerrero et al. | |
| 8,494,829 B2 | 7/2013 | Teixeira | |
| 8,510,523 B2 | 8/2013 | Szegedi et al. | |
| 9,594,942 B2 | 3/2017 | Saklatvala | |
| 2004/0153847 A1 | 8/2004 | Apte et al. | |
| 2007/0117568 A1 | 5/2007 | Misikangas et al. | |
| 2008/0312885 A1 | 12/2008 | Chu et al. | |
| 2010/0023460 A1 * | 1/2010 | Hughes | G06Q 40/06 705/36 R |

(Continued)

OTHER PUBLICATIONS

Gottschalk, "Probabilistic/stochastic environmental exposure modeling: Methodology and applications to engineered nanomaterials," Dissertation Submitted to ETH Zurich, 2010, p. 1-136, Diss. ETH No. 19022.

(Continued)

*Primary Examiner* — Andy Ho
(74) *Attorney, Agent, or Firm* — Patricia B. Feighan

(57) ABSTRACT

A method to provide multiple probability distributions for an input simulation variable or an input simulation event based on at least one pre-defined, mutually exclusive condition being used, wherein the input variable or the input simulation event are associated with a design of a probabilistic setup is provided. The method may include receiving at least one pre-defined condition and determining if at least one pre-defined condition is a mutually exclusive condition entered by a user. The method may include determining if a plurality of distributions associated with at least one pre-defined condition is to be assigned from a plurality of existing data. The method may include selecting at least one required variable based on the determining and assigning the plurality of distributions. The method may include populating a plurality of required fields and prompting the user to edit or enter at least one required distribution name.

20 Claims, 5 Drawing Sheets

(56) References Cited

U.S. PATENT DOCUMENTS

2013/0262069 A1  10/2013  Leonard
2015/0006122 A1   1/2015  Du

OTHER PUBLICATIONS

Parodi et al., "Monte Carlo simulations to support start-up and treatment planning of scanned proton and carbon ion therapy at a synchrotron-based facility," Physics in Medicine and Biology, 2012, vol. 57, No. 12, Abstract Only, http://iopscience.iop.org/0031-9155/57/12/3759, Accessed on Sep. 22, 2014.

Smid et al., "Strengths and weaknesses of Monte Carlo simulation models and Bayesian belief networks in microbial risk assessment," International Journal of Food Microbiology, May 30, 2010, p. S57-S63, vol. 139, Abstract Only, http://www.sciencedirect.com/science/article/pii/S0168160509006680, Accessed on Sep. 22, 2014.

Gottschalk et al., "Probabilistic Material Flow Modeling for Assessing the Environmental Exposure to Compounds Methodology and an Application to Engineered Nano-TiO2 Particles," Environmental Modelling & Software, Mar. 2010, p. 320-332, vol. 25, Issue 3, Elsevier Ltd.

* cited by examiner

PROBABILISTIC SIMULATION SCENARIO DESIGN BY USING MULTIPLE CONDITIONAL AND NESTED PROBABILITY DISTRIBUTION INPUT FUNCTIONS

BACKGROUND

The present invention relates generally to the field of computing, and more particularly to probabilistic simulation scenario design.

The objective of many simulations is to identify and quantify the risks associated with a particular option, plan or design. While designing a probabilistic simulation, such as Monte Carlo simulation, the designer has the option of selecting a single probability distribution. During the actual simulation, random values are used to extract individual values for the variable from the given probability distribution. Then, a range of the final outcome (with confidence intervals and significance) is calculated depending upon the range of individual output outcome from individual record sets.

SUMMARY

According to one embodiment, a method to provide multiple probability distributions for an input simulation variable or an input simulation event based on at least one pre-defined, mutually exclusive condition being used by the input variable or the input simulation event, whereby the input variable or the input simulation event are associated with a design of a probabilistic setup is provided. The method may include receiving at least one pre-defined condition associated with the input variable or the input simulation event. The method may also include determining if at least one pre-defined condition is a mutually exclusive condition entered by a user. The method may further include determining if a plurality of distributions associated with at least one pre-defined condition is to be assigned from a plurality of existing data based on at least one pre-defined condition being mutually exclusive. The method may additionally include selecting at least one required variable based on the determining that the plurality of distributions associated with at least one pre-defined condition is to be assigned from the plurality of existing data. The method may also include assigning the plurality of distributions using a plurality of required, default settings based on the selected at least one variable. The method may further include populating a plurality of required fields, whereby the plurality of required fields include a plurality of names and a plurality of parameters associated with the plurality of assigned distributions. The method may also include prompting the user to edit or enter at least one required distribution name from the plurality of assigned distributions.

Additionally, according to at least one embodiment, a method to provide multiple probability distributions for an input simulation variable or an input simulation event based on an occurrence of at least one nested probabilistic event, whereby the nested probabilistic event is used by at least one input variable associated with a design of a probabilistic setup is provided. The method may include prompting a user to select at least one parent probability distribution from a plurality of distributions, wherein the selected at least one parent probability distribution is associated with a first stage of nesting. The method may also include simulating a plurality of outcome values based on the selected at least one parent probability distribution associated with the first stage of nesting. The method may further include formulating at least one mutually exclusive event criteria associated with a second stage of nesting, whereby at least one mutually exclusive event criteria is formulated based on the simulated plurality of outcome values. The method may additionally include determining at least one nested probability distribution for the second stage of nesting based on the formulated at least one mutually exclusive event criteria. The method may also include selecting at least one determined nested probability distribution for the second stage of nesting.

According to another embodiment, a computer system to provide multiple probability distributions for an input simulation variable or an input simulation event based on at least one pre-defined, mutually exclusive condition being used by the input variable or the input simulation event, whereby the input variable or the input simulation event are associated with a design of a probabilistic setup is provided. The computer system may include one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method. The method may include receiving at least one pre-defined condition associated with the input variable or the input simulation event. The method may also include determining if at least one pre-defined condition is a mutually exclusive condition entered by a user. The method may further include determining if a plurality of distributions associated with at least one pre-defined condition is to be assigned from a plurality of existing data based on at least one pre-defined condition being mutually exclusive. The method may additionally include selecting at least one required variable based on the determining that the plurality of distributions associated with at least one pre-defined condition is to be assigned from the plurality of existing data. The method may also include assigning the plurality of distributions using a plurality of required, default settings based on the selected at least one variable. The method may further include populating a plurality of required fields, whereby the plurality of required fields include a plurality of names and a plurality of parameters associated with the plurality of assigned distributions. The method may also include prompting the user to edit or enter at least one required distribution name from the plurality of assigned distributions.

Additionally, according to at least one embodiment, the computer system may include a method to provide multiple probability distributions for an input simulation variable or an input simulation event based on an occurrence of at least one nested probabilistic event, whereby the nested probabilistic event is used by at least one input variable associated with a design of a probabilistic setup. The method may include prompting a user to select at least one parent probability distribution from a plurality of distributions, wherein the selected at least one parent probability distribution is associated with a first stage of nesting. The method may also include simulating a plurality of outcome values based on the selected at least one parent probability distribution associated with the first stage of nesting. The method may further include formulating at least one mutually exclusive event criteria associated with a second stage of nesting, whereby at least one mutually exclusive event criteria is formulated based on the simulated plurality of outcome values. The method may additionally include determining at least one nested probability distribution for the second stage of nesting based on the formulated at least one mutually exclusive event criteria. The method may also include selecting at least one determined nested probability distribution for the second stage of nesting.

According to yet another embodiment, a computer program product that provides multiple probability distributions for an input simulation variable or an input simulation event based on at least one pre-defined, mutually exclusive condition being used by the input variable or the input simulation event, wherein the input variable or the input simulation event are associated with a design of a probabilistic setup is provided. The computer program product may include one or more computer-readable tangible storage medium and program instructions stored on at least one of the one or more tangible storage medium, the program instructions executable by a processor. The computer program product may include program instructions to receive at least one pre-defined condition associated with the input variable or the input simulation event. The computer program product may also include program instructions to determine if at least one pre-defined condition is a mutually exclusive condition entered by a user. The computer program product may further include program instructions to determine if a plurality of distributions associated with at least one pre-defined condition is to be assigned from a plurality of existing data based on at least one pre-defined condition being mutually exclusive. The computer program product may additionally include program instructions to select at least one required variable based on the determining that the plurality of distributions associated with at least one pre-defined condition is to be assigned from the plurality of existing data. The computer program product may also include program instructions to assign the plurality of distributions using a plurality of required, default settings based on the selected at least one variable. The computer program product may further include program instructions to populate a plurality of required fields, wherein the plurality of required fields include a plurality of names and a plurality of parameters associated with the plurality of assigned distributions. The program instructions may also include prompting the user to edit or enter at least one required distribution name from the plurality of assigned distributions.

Additionally, according to at least one embodiment, the computer program product may provide multiple probability distributions for an input simulation variable or an input simulation event based on an occurrence of at least one nested probabilistic event, whereby the nested probabilistic event is used by at least one input variable associated with a design of a probabilistic setup. The computer program product may include program instructions to prompt a user to select at least one parent probability distribution from a plurality of distributions, whereby the selected at least one parent probability distribution is associated with a first stage of nesting. The computer program product may also include program instructions to simulate a plurality of outcome values based on the selected at least one parent probability distribution associated with the first stage of nesting. The computer program product may further include program instructions to formulate at least one mutually exclusive event criteria associated with a second stage of nesting, whereby at least one mutually exclusive event criteria is formulated based on the simulated plurality of outcome values. The computer program product may additionally include program instructions to determine at least one nested probability distribution for the second stage of nesting based on the formulated at least one mutually exclusive event criteria. The computer program product may also include program instructions to select at least one determined nested probability distribution for the second stage of nesting.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
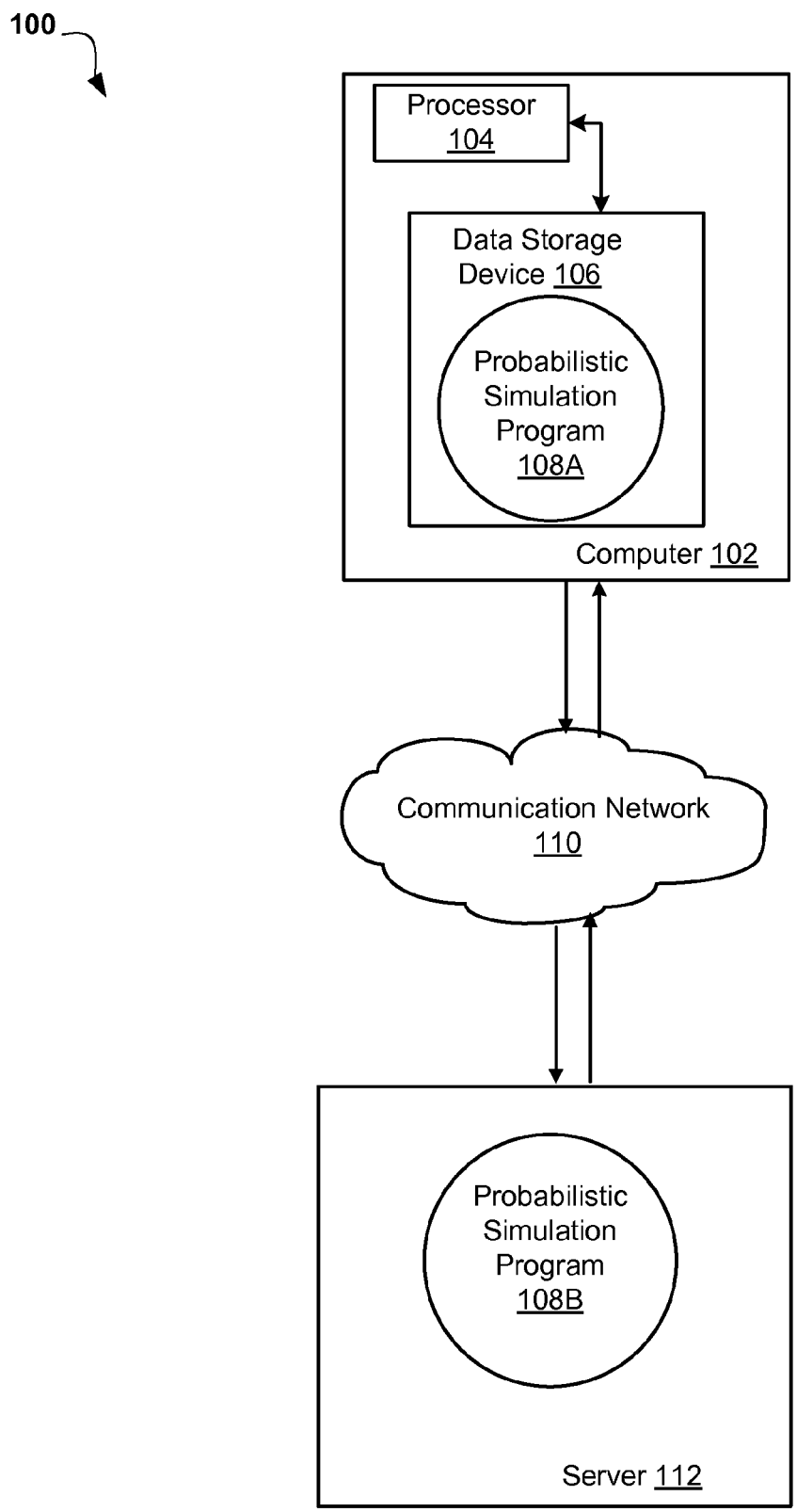
FIG. 1 illustrates a networked computer environment according to one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the present invention relate to the field of computing, and more particularly to probabilistic simulation scenario design. The following described exemplary embodiments provide a system, method and program product to, among other things, improve probabilistic simulation scenario design by using multiple conditional and nested probability distribution input functions.

As previously described with respect to probabilistic simulation, during the actual simulation, random values are used to extract individual values for the variable from the given probability distribution. Then, a range of the final outcome (with confidence intervals and significance) is calculated depending upon the range of individual output outcome from individual record sets. However, such a solution allows for only a particular distribution (with its specific customizable parameters) to be assigned to a particular continuous or discrete input variable or event. As such, in a real life scenario, some of these input variables may either change their entire probability distribution, or the specific parameter of their pre-defined probability distribution, depending upon various systemic (or other) conditions or across time. However, due their inherent limitations, the existing simulation routines are not capable to cater to such dynamic and complex simulation setup, and hence may prove sub-optimal for the simulation of such real-life dynamic scenarios.

The following is an example illustrating such a limitation with respect to a real-life dynamic scenario: The ideal width of a common passage in a shopping mall may need to be determined. The common passage way may have shops belonging to different retail format categories and the shops may have different shapes and sizes, spread on either side of the common passage. Some of the essential input variable in this simulation design are the number of people plying per unit time through this common passage; the average speed of these people; the number of people stranded outside each of these shops (window shopping) per unit time; and the average duration of their stay on this common passage etc. Focusing on each of these parameters one by one, it may be determined that on a normal day, from morning until evening, the probability distribution function for a particular input variable, such as the number of people plying across the common passage, follows a normal distribution with mean $m1$, standard deviation $s1$, skewness $w1$, and kurtosis $k1$. However, if the environmental conditions change and on a particular day there occurs a much publicized sale on women's apparel in one of the stores at a particular corner of this common passage, under this condition the above probability distribution for the given variable might not prevail. As such, it may either change the parameters or retain the distribution type. Therefore, the new distribution may still remain a normal distribution, but with mean $m2$, standard deviation $s2$, skewness $w2$, and kurtosis $k2$, or in an even more dynamic scenario might assume an entirely different probability distribution, say a triangular distribution with mean $m3$, minimum $n3$, and maximum $x3$.

Similarly, the probability distributions (or the specific probability distribution parameters) of all the involved input variable may potentially change under different conditions/events or the different levels of a nested condition or event. Furthermore, to simulate the real life conditions more closely and accurately, the occurrence of such condition(s) may be the result of a given parent probability distribution.

Therefore the final outcome of a variable may be summarized to be a function of a conditional probability distribution, where the condition itself is the outcome of a different probability distribution. As such, these conditions and their outcomes may be nested into layers/stages, so as to give rise to a highly realistic (and also complex) scenario. The current probabilistic simulation design/setups do not allow for such advanced setups, and therefore are sub-optimal for simulating such realistic scenarios accurately. Therefore, it may be advantageous, among other things, to improve probabilistic simulation scenario design by using multiple conditional and nested probability distribution input functions.

According to the present embodiment, two methods of incorporating the changing probability distributions (or the distribution's parameters) of the input variables of a simulation setup may be implemented. The two methods may be implemented on the basis of either a logical condition variable or a probabilistic event occurrence even under multiple levels of nesting of such events or conditions. As such, once incorporated in a simulation engine, the present embodiment may provide very accurate results of real life dynamic business conditions and scenarios as well as provide very rich insights of the dynamic landscape the business is operating into. These insights may be further used to optimize the business planning and better prepare for averting identified risk and exploiting identified opportunities. Furthermore, the present embodiment may be included in existing simulation packages and other software supporting and forming probabilistic simulation routines. As such, the present embodiment may assist in solving the evolving need of customers to extract richer insights from more realistic simulation setups, so as to better plan their business and formulate better strategies for potential risks and opportunities.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product to improve probabilistic simulation scenario design by using multiple conditional and nested probability distribution input functions. According to at least one implementation, the present embodiment may include a provision for multiple probability distributions for any input simulation variable/event based on pre-defined logical mutually exclusive conditions or state of preceding discrete events, being used by any/each input variable used in the design of a probabilistic simulation setup. As such, the system may give a user the option to have as many probability distributions attached to each variable as the user wants. Then, each of these probability distributions may be attached to the fulfillment of some pre-defined logical mutually exclusive conditions as given by the user. On the failure of all the given conditions, the user may also have a default probability distribution to select from.

Additionally, all the standard parameters for each of these distributions may be either customized by the user or fitted from the data distribution of a given variable in the data set. Furthermore, all standard/proprietary distribution sets corresponding to the variable type may be provided (e.g., Normal, Lognormal, Triangular, Poisson, Categorical, Exponential, Beta, Gamma, Binomial, Bernoulli, Reverse Bernoulli, Exponential, Categorical, Weibull, Uniform, Range, Fixed etc.) for the user to choose from and the option given to customize the distribution values/parameters, and to standardize or unstandardize them.

According to at least one implementation with respect to these distributions, one of the values may be "Fixed" which means that the user may even choose a fixed value instead of a probability distribution for a variable under a particular condition. Therefore, further enriching the simulation design by providing the option of mixing pre-defined non-probabilistic actions and probabilistic events on the occurrence of different conditions.

Additionally, to support a truly distinct nature for these probability distributions, the user may even modify the random number seed for each of these distributions. For example, once such a scenario has been setup and simulation starts, for each data point in the simulation, the mutually exclusive condition sets may be evaluated and on the basis of the positive/affirmative occurrence of a particular condition set, the values may be picked from the probability distribution corresponding to the set of conditions met. Random numbers may be generated from either the system defined or user defined seed (as requested) for the processing of the final values for the given record from the selected distribution.

However, under such a nested simulation setup, the number of data points to be simulated may be significantly higher as compared to that in a non-conditional probability distribution setup. As such, care must be taken while deciding the stopping criteria to ensure sufficient data points from each point has been simulated, or the desired result is within the confidence interval and significance required by the user, without impacting the performance/user experience significantly.

Therefore, if an option is given to the user to select the number of simulations for the stopping criteria, then the user may be prompted with the minimum level of simulations that may be required in the desired setup to achieve respectable statistical significance for the results. According to the present embodiment, any standard confidence level or significance calculation may be used to arrive at this figure.

Furthermore, implementations of the present embodiment may allow for provisioning of multiple nested probability distributions on the basis of the occurrence of some other higher level nested probabilistic event, being used by any/each input variable used in the design of a probabilistic simulation setup. As such, rather than starting with the identification of pre-defined logical mutually exclusive conditions, the user may be given the option to choose from a base, customizable, parent probability distribution in the first/parent stage of nesting. Then, the parent probability distribution's simulated outcome values in terms of cumulative or absolute probabilities, may be used in the second step/stage to formulate mutually exclusive event criteria which may determine which particular nested probability distribution is selected in the next lower level nested stage.

As the condition and complexity/accuracy requirements may be increased, more levels of conditional nesting may be spawned to achieve the given real-life scenario. Furthermore, the nesting may be non-homogeneous as well. For example, where for condition set 1, the nesting ends at level/stage 2, for condition set 2, the nesting may even continue further and so forth.

Additionally, for the lower/stage two nested probability distributions, the stage one parent probability distribution function may also be any of the standard/proprietary probability distribution functions, except "fixed".

However, in the case where fixed values are to be given for the parent distribution, then the probability of occurrence for each fixed value may be customized for all such fixed values, such as the sum of individual probabilities for all these fixed values is unity. Similarly, the same may apply for any of the subsequent stage non terminal (not at the end stage) probability distribution. Furthermore, all the values of this distribution may be customized and standardized/unstandardized. In accordance with the present embodiment, this may also be fitted from a given variable in the data set rather than manually selecting one from the given set and customizing it.

Once all the parameters and configuration has been setup, and the simulation process starts, the method may first simulate the value for the stage 1/parent distribution and based on the probability value of stage 1 distribution (cumulative or absolute probability as selected by the user), the pre-selected stage two probability distribution may be determined/triggered. Then the probability obtained from the stage two distribution may be added as the final value for that particular simulation record set or alternatively for the third/subsequent probability distribution until the terminal stage for that piece of the selection is reached.

Referring now to FIG. 1, an exemplary networked computer environment 100 in accordance with one embodiment is depicted. The networked computer environment 100 may include a computer 102 with a processor 104 and a data storage device 106 that is enabled to run a Probabilistic Simulation Program 108A. The networked computer environment 100 may also include a server 112 that is enabled to run a Probabilistic Simulation Program 108B and a communication network 110. The networked computer environment 100 may include a plurality of computers 102 and servers 112, only one of which is shown for illustrative brevity. The communication network may include various types of communication networks, such as a wide area network (WAN), local area network (LAN), a telecommunication network, a wireless network, a public switched network and/or a satellite network. It may be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with server computer 112 via the communications network 110. The communications network 110 may include connections, such as wire, wireless communication links, or fiber optic cables. As will be discussed with reference to FIG. 3, server computer 112 may include internal components 800a and external components 900a, respectively and client computer 102 may include internal components 800b and external components 900b, respectively. Client computer 102 may be, for example, a mobile device, a telephone, a personal digital assistant, a netbook, a laptop computer, a tablet computer, a desktop computer, or any type of computing device capable of running a program and accessing a network.

A program, such as a Probabilistic Simulation Program 108A and 108B may run on the client computer 102 or on the server computer 112. The Probabilistic Simulation Program 108A, 108B may improve probabilistic simulation scenario design by using multiple conditional and nested probability distribution input functions. The Probabilistic Simulation method is explained in further detail below with respect to FIGS. 2A-2C.

Figure 2A:
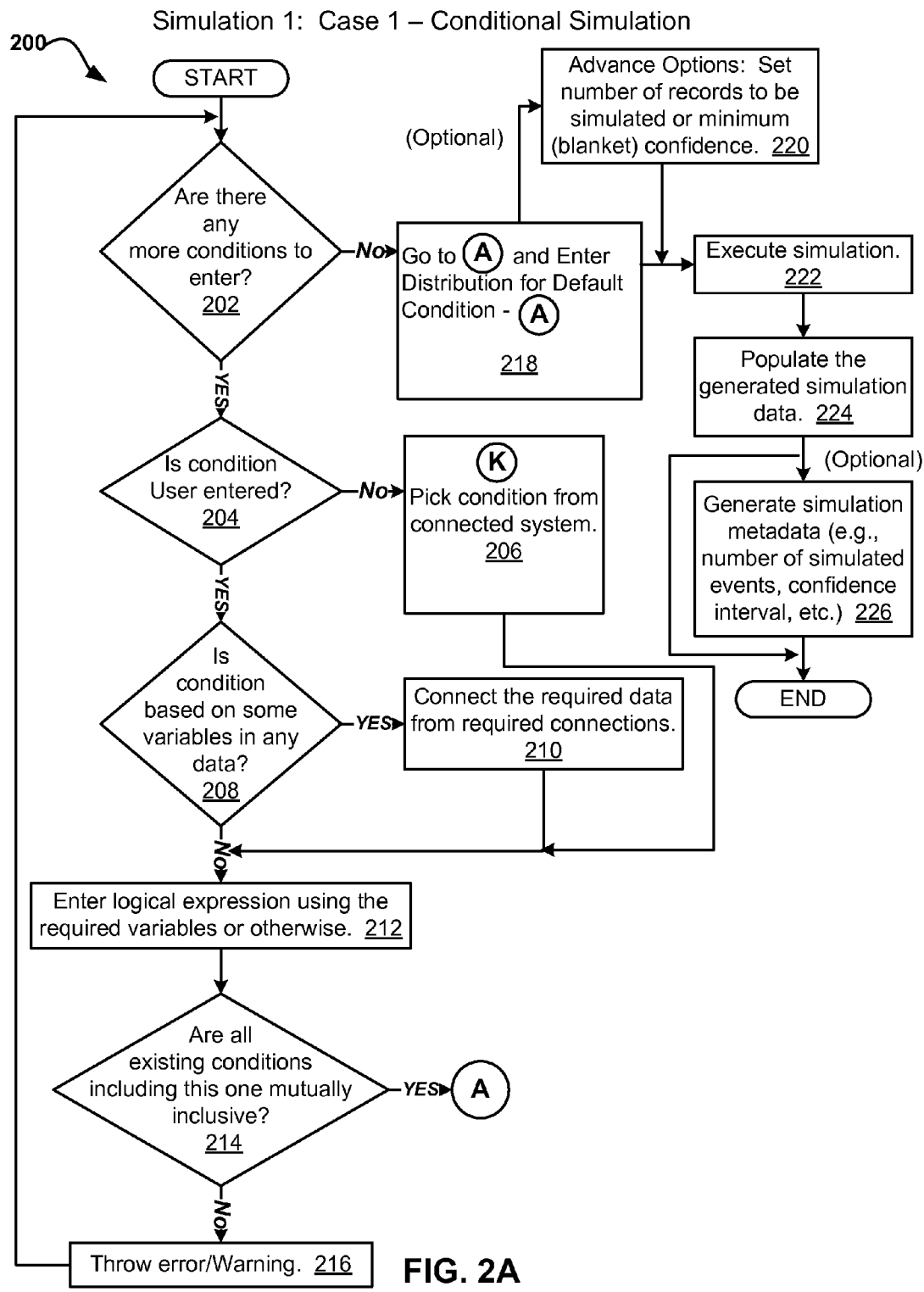
FIGS. 2A-2C are operational flowcharts illustrating the steps carried out by a program to improve probabilistic simulation scenario design by using multiple conditional and nested probability distribution input functions according to at least one embodiment.
Figure 2B:
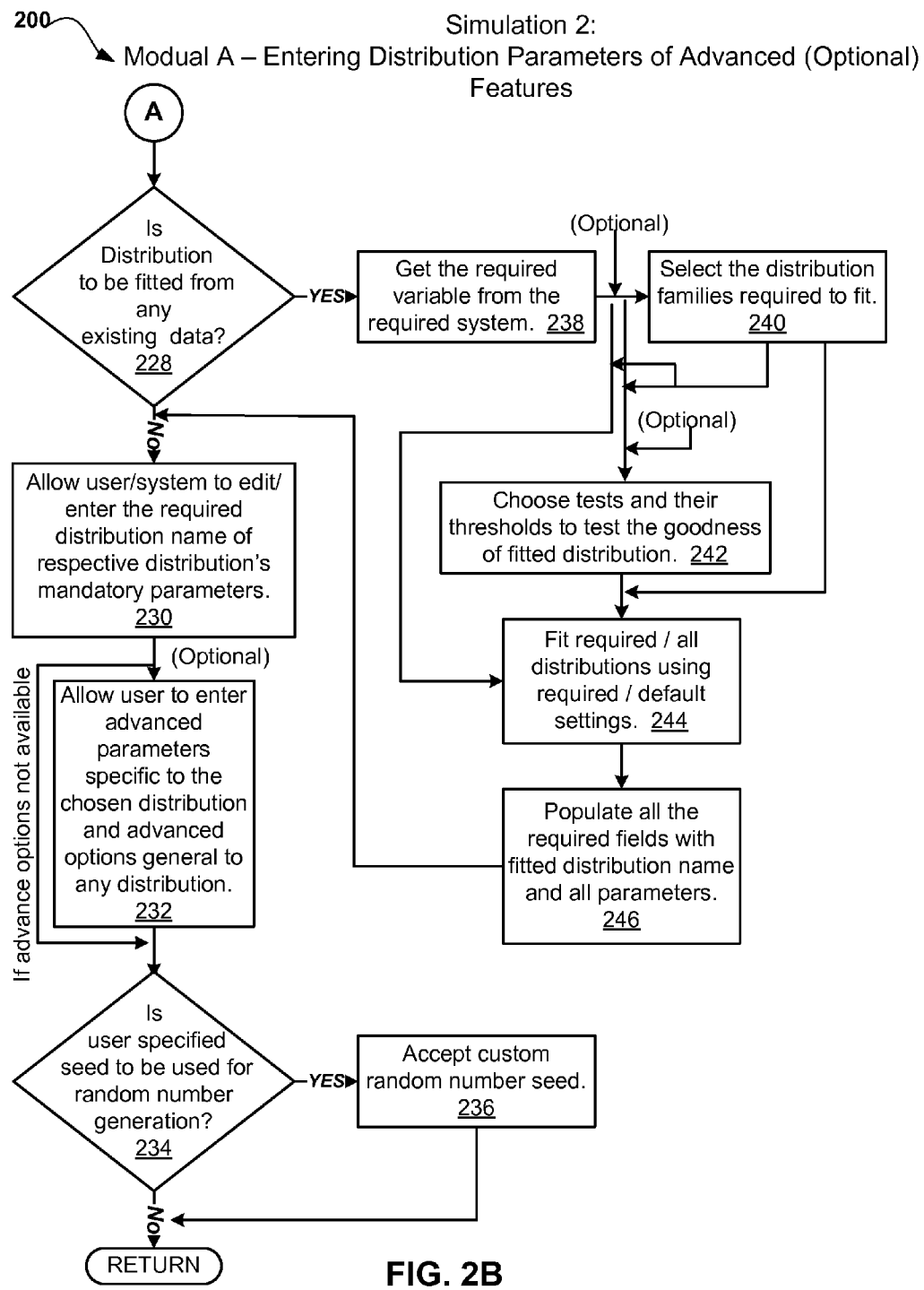
Figure 2C:
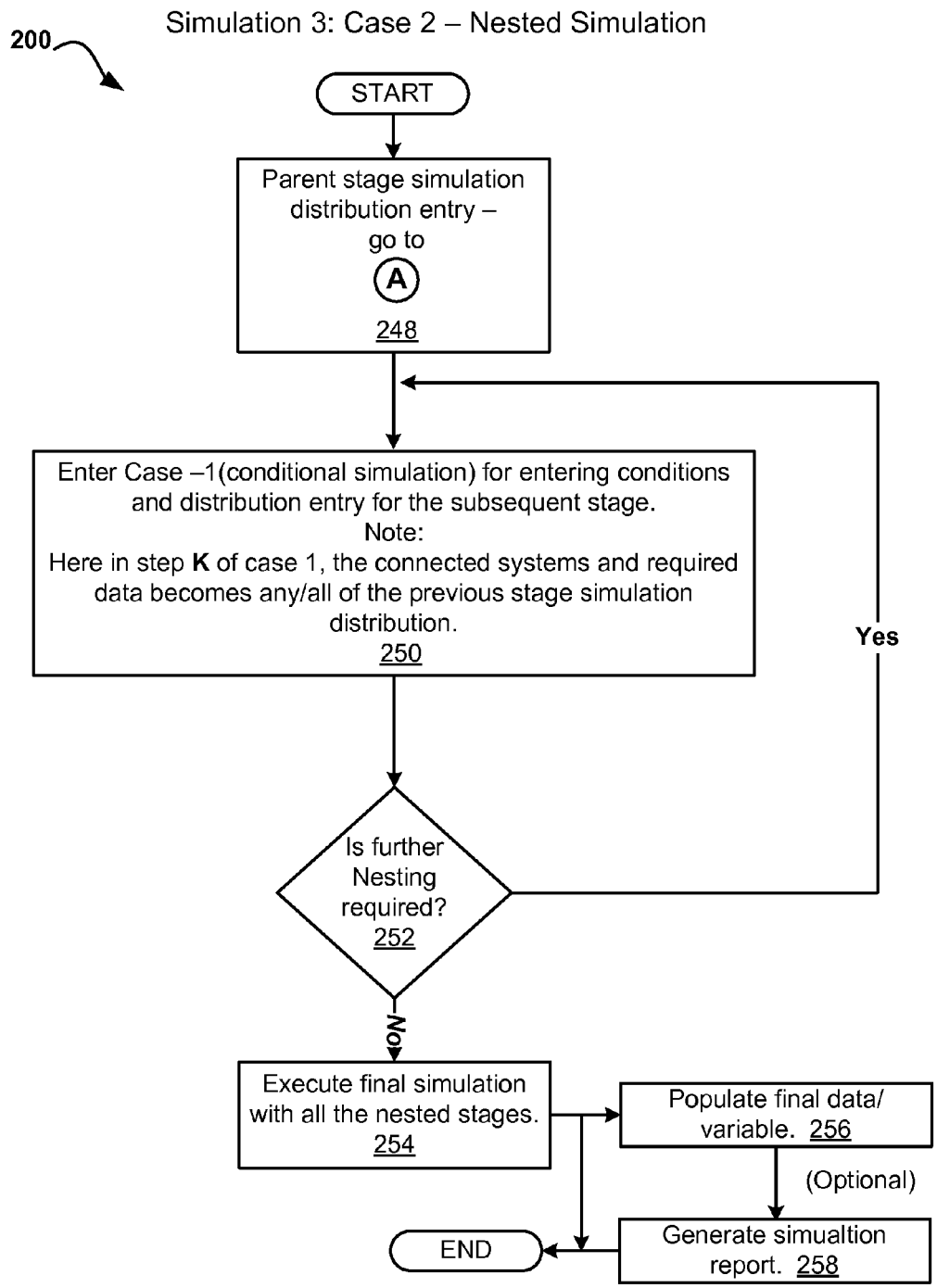

FIGS. 2A-2C, operational flowcharts illustrating the steps 200 carried out by methods of a program to improve probabilistic simulation scenario design by using multiple conditional and nested probability distribution input functions in accordance with one embodiment are depicted. According to the present embodiment, the Probabilistic Simulation Program 108A, 108B (FIG. 1) may include two methods of incorporating the changing probability distribution (or the distribution's parameters) of the input variables of a simulation setup. As previously described, the Probabilistic Simulation Program 108A, 108B (FIG. 1) may be implemented on the basis of either a logical condition variable or a probabilistic event occurrence even under multiple levels of nesting of such events or conditions.

Referring now to FIG. 2A, an operational flowchart illustrating the steps 200 of the method for conditional simulation in accordance with one embodiment is depicted. At 202, it is determined whether there are any more conditions to enter. If at 202 it is determined that there are more conditions to enter, then at 204, it is determined whether the condition is user entered. According to at least one implementation, the present embodiment may provision for multiple probability distributions for any input simulation variable or event based on pre-defined logical, mutually exclusive conditions or state of preceding discrete events being used by any/each input variable used in the design of a probabilistic simulation setup. As such, The Probabilistic Simulation Program 108A, 108B (FIG. 1) may give the user the option to have as many probability distributions attached to each variable as the user wants to have and each of these probability distributions may be attached to the fulfillment of a pre-defined logical, mutually exclusive condition as given by the user.

If at 204 it is determined that the condition is not user entered, then The Probabilistic Simulation Program 108A, 108B (FIG. 1) may select a condition from a repository, such as a database located on a connected system at 206 and then, the method may continue to step 212 explained in further detail below. However, if at 204 it is determined that the condition is user entered, then at 208, it is determined whether the condition is based on some variables in any data.

If at 208 it is determined that the condition is based on some variables in any data, then at 210 The Probabilistic Simulation Program 108A, 108B (FIG. 1) may connect the required data from the required connections. However, if at 208 it is determined that the condition is not based on some variables in any data, then at 212, the logical expression is entered using the required variables or otherwise.

Next at 214, it is determined whether all the conditions including this one is mutually inclusive. If at 214 it is determined that all the conditions including this one is mutually inclusive, then the method may continue to enter the distribution parameters of the advanced (optional) features which is depicted as "Modual A" in FIG. 2B which will be explained in further detail below.

However, if at 214 it is determined that all the conditions including this one is not mutually inclusive, then the method may continue to 216 and issue an error or warning to the user. Then, the method may continue back to step 202 and determine whether there are any more conditions to enter. If at 202 it is determined that there are not any more conditions to enter, then the method may continue to "Modual A" in FIG. 2B (explained in more detail below) and then enter the distribution for the default condition at 218.

Next, the method may optionally continue to step 220 to perform advance options, such as setting the number of records to be simulated or setting a minimum (blanket) confidence level. Then at 222, the method will execute the simulation and at 224, populate the generated simulation data.

Optionally, at 226, the method may generate simulation metadata, such as the number of simulated events, confidence, interval, etc. prior to the method ending.

Referring now to FIG. 2B, an operational flowchart illustrating the steps 200 of the method (i.e., "Modual A") to enter the distribution parameters of the advanced (optional) features in accordance with the present embodiment is depicted. According to at least one implementation, upon the failure of all the given conditions as explained with respect to FIG. 2A, the user may have a default probability distribution to choose from. As such, all the standard parameters for each of these distributions can either be customized by the user or fitted from the data distribution of a given variable in the data set.

Therefore, at step 228, the method determines whether the distribution is to be fitted from any existing data. If at 228, it is determined that the distribution is not to be fitted from any existing data, then at 230, the user or system is allowed to edit/enter the required distribution name of the respective distribution's mandatory parameters. Then, optionally, at 232, the user may be allowed to enter advanced parameters specific to the chosen distribution and advanced options general to any distribution.

Next, the method may continue to 234 if the advance option is not available. As such, at 234, it is determined whether the user specified seed is to be used for random number generation. If at 234 it is determined that the user specified seed is not to be used for random number generation, then the method may return to the step that invoked the function of "Module A". However, if at 234 it is determined that the user specified seed is to be used for random number generation, then the method may continue to step 236 to accept the custom random number seed and then the method may return to the step that invoked the function of "Module A".

If at 228 it is determined that the distribution is to be fitted from any existing data, then the method may continue to step 238 to get the required variable from the required system.

Then at 240, the method may optionally select from a repository, the distribution families required to fit and may optionally choose the tests and their thresholds to test the goodness of the fitted distribution at 242.

Next at 244, the method may fit the required or all distributions using the required or default settings. Then at 246, the method may populate all the required fields with the fitted distribution name and the parameters. Next, the method may continue to step 230, previously described, to allow the user or system to edit or enter the required distribution name of the respective distribution's mandatory parameters.

Referring now to FIG. 2C, an operational flowchart illustrating the steps 200 of the method for nested simulation in accordance with one embodiment is depicted. As previously described, the method may provision for multiple nested probability distributions on the basis of the occurrence of some other higher level nested probabilistic event being used by any/each input variable used in the design of a probabilistic simulation setup. As such, rather than starting with the identification of pre-defined logical, mutually exclusive conditions, the user may be given the option to choose from a base, customizable, parent probability distribution in the first/parent stage of nesting, whose simulated outcome values in terms of cumulative or absolute probabilities, may be used in the second step/stage to formulate mutually exclusive event criteria which may determine which particular nested probability distribution is selected in the next lower level nested stage.

Therefore, at 248, the parent stage simulation distribution entry is started. As such, the method executes the steps of "Module A", previously described with respect to FIG. 2 B. Then at 250, case 1 is entered (i.e., conditional simulation) for entering the conditions and distribution entry for the subsequent stage. Therefore, according to at least one implementation, in step K (i.e., step 206 (FIG. 2A) of case 1), the connected systems and required data may become any or all of the previous stage simulation distribution.

Next at 252, it is determined whether further nesting is required. If at 252 it is determined that further nesting is required, then the method may continue back to step 250 previously described. However, if at 252 it is determined that further nesting is not required, then the method may continue at 254 to execute the final simulation with all the nested stages.

Then at 256, the method may populate final data or variable. Next, the method may optionally continue to generate a simulation report at 258. Then, the method may end.

It may be appreciated that FIGS. 2A-2C provide only an illustration of one implementation and does not imply any limitations with regard to how different embodiments may be implemented. Many modifications to the depicted environments may be made based on design and implementation requirements.

Figure 3:
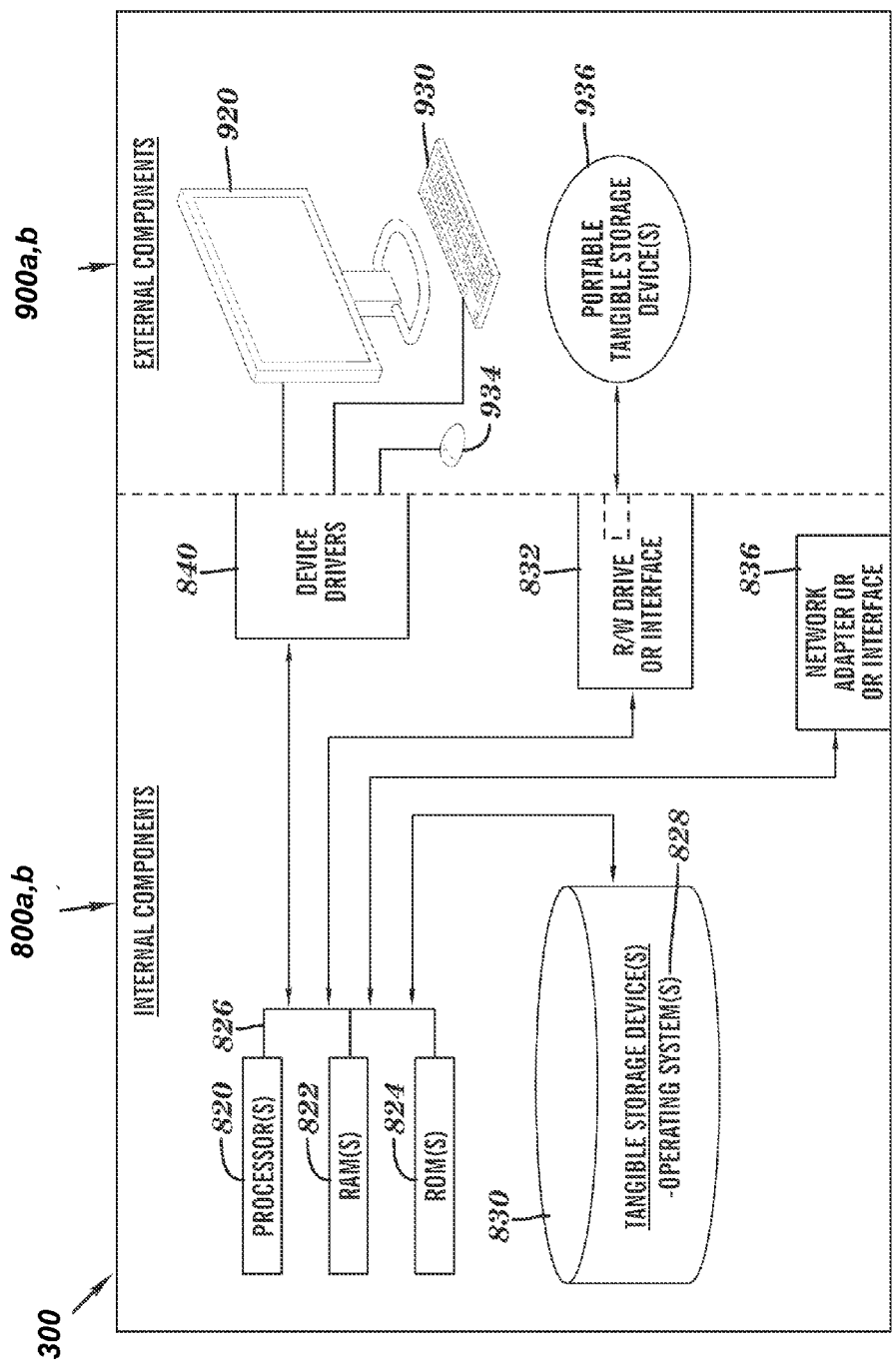
FIG. 3 is a block diagram of internal and external components of computers and servers depicted in FIG. 1 according to at least one embodiment.

FIG. 3 is a block diagram 300 of internal and external components of computers depicted in FIG. 1 in accordance with an illustrative embodiment of the present invention. It should be appreciated that FIG. 3 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may be represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 (FIG. 1), and network server 112 (FIG. 1) may include respective sets of internal components 800 a, b and external components 900 a, b illustrated in FIG. 3. Each of the sets of internal components 800 a, b includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and Probabilistic Simulation Program 108A (FIG. 1) in client computer 102 (FIG. 1) and Probabilistic Simulation Program 108B (FIG. 1) in network server computer 112 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 3, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800 a, b, also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as Probabilistic Simulation Program 108A (FIG. 1) and 108B (FIG. 1), can be stored on one or more of the respective portable computer-readable tangible storage devices 936, read via the respective R/W drive or interface 832 and loaded into the respective hard drive 830.

Each set of internal components 800 a, b also includes network adapters or interfaces 836 such as a TCP/IP adapter cards, wireless Wi-Fi interface cards, or 3G or 4G wireless interface cards or other wired or wireless communication links. The Probabilistic Simulation Program 108A (FIG. 1) in client computer 102 (FIG. 1) and Probabilistic Simulation Program 108B (FIG. 1) in network server 112 (FIG. 1) can be downloaded to client computer 102 (FIG. 1) from an external computer via a network (for example, the Internet, a local area network or other, wide area network) and respective network adapters or interfaces 836. From the network adapters or interfaces 836, the Probabilistic Simulation Program 108A (FIG. 1) in client computer 102 (FIG. 1) and the Probabilistic Simulation Program 108B (FIG. 1) in network server computer 112 (FIG. 1) are loaded into the respective hard drive 830. The network may comprise copper wires, optical fibers, wireless transmission, routers, firewalls, switches, gateway computers and/or edge servers.

Each of the sets of external components 900 a, b can include a computer display monitor 920, a keyboard 930, and a computer mouse 934. External components 900 a, b can also include touch screens, virtual keyboards, touch pads, pointing devices, and other human interface devices. Each of the sets of internal components 800 a, b also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method to provide multiple probability distributions for an input simulation variable or an input simulation event based on at least one pre-defined, mutually exclusive condition being used by the input variable or the input simulation event, wherein the input variable or the input simulation event are associated with a design of a probabilistic setup, the method comprising:
   receiving, by a processor, at least one pre-defined condition associated with the input variable or the input simulation event;
   determining if the at least one pre-defined condition is a mutually exclusive condition entered by a user;
   determining if a plurality of distributions associated with the at least one pre-defined condition is to be assigned from a plurality of existing data based on the at least one pre-defined condition being mutually exclusive;
   selecting at least one required variable based on the determining that the plurality of distributions associated with the at least one pre-defined condition is to be assigned from the plurality of existing data;
   assigning the plurality of distributions using a plurality of required, default settings based on the selected at least one variable;
   populating a plurality of required fields, wherein the plurality of required fields include a plurality of names and a plurality of parameters associated with the plurality of assigned distributions; and
   prompting the user to edit or enter at least one required distribution name from the plurality of assigned distributions.

2. The method of claim 1 further comprising:
   prompting the user to select at least one parent probability distribution from the plurality of distributions, wherein the selected at least one parent probability distribution is associated with a first stage of nesting;
   simulating a plurality of outcome values based on the selected at least one parent probability distribution associated with the first stage of nesting;
   formulating at least one mutually exclusive event criteria associated with a second stage of nesting, wherein the at least one mutually exclusive event criteria is formulated based on the simulated plurality of outcome values;
   determining at least one nested probability distribution for the second stage of nesting based on the formulated at least one mutually exclusive event criteria; and selecting the at least one determined nested probability distribution for the second stage of nesting.

3. The method of claim 1, wherein the plurality of parameters associated with the plurality of assigned distributions can be customized by the user.

4. The method of claim 2, wherein the formulated at least one mutually exclusive event criteria associated with the second stage of nesting will determine a probability distribution to be selected in at least one next lower level nested stage.

5. The method of claim 2, wherein the selected at least one parent probability distribution is customizable.

6. The method of claim 2, wherein the simulated plurality of outcome values comprise of at least one cumulative probability or at least one absolute probability.

7. The method of claim 1, wherein a selected at least one nested probability distribution for a second stage of nesting can be used to create at least one more level of conditional testing.

8. A computer system to provide multiple probability distributions for an input simulation variable or an input simulation event based on at least one pre-defined, mutually exclusive condition being used by the input variable or the input simulation event, wherein the input variable or the input simulation event are associated with a design of a probabilistic setup, the computer system comprising:
   one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
   receiving at least one pre-defined condition associated with the input variable or the input simulation event;
   determining if the at least one pre-defined condition is a mutually exclusive condition entered by a user;
   determining if a plurality of distributions associated with the at least one pre-defined condition is to be assigned from a plurality of existing data based on the at least one pre-defined condition being mutually exclusive;
   selecting at least one required variable based on the determining that the plurality of distributions associated with the at least one pre-defined condition is to be assigned from the plurality of existing data;
   assigning the plurality of distributions using a plurality of required, default settings based on the selected at least one variable;
   populating a plurality of required fields, wherein the plurality of required fields include a plurality of names and a plurality of parameters associated with the plurality of assigned distributions; and
   prompting the user to edit or enter at least one required distribution name from the plurality of assigned distributions.

9. The computer system of claim 8, further comprising:
   prompting the user to select at least one parent probability distribution from the plurality of distributions, wherein the selected at least one parent probability distribution is associated with a first stage of nesting;
   simulating a plurality of outcome values based on the selected at least one parent probability distribution associated with the first stage of nesting;
   formulating at least one mutually exclusive event criteria associated with a second stage of nesting, wherein the at least one mutually exclusive event criteria is formulated based on the simulated plurality of outcome values;
   determining at least one nested probability distribution for the second stage of nesting based on the formulated at least one mutually exclusive event criteria; and
   selecting the at least one determined nested probability distribution for the second stage of nesting.

10. The computer system of claim 8, wherein the plurality of parameters associated with the plurality of assigned distributions can be customized by the user.

11. The computer system of claim 9, wherein the formulated at least one mutually exclusive event criteria associated with the second stage of nesting will determine a probability distribution to be selected in at least one next lower level nested stage.

12. The computer system of claim 9, wherein the selected at least one parent probability distribution is customizable.

13. The computer system of claim 9, wherein the simulated plurality of outcome values comprise of at least one cumulative probability or at least one absolute probability.

14. The computer system of claim 8, wherein a selected at least one nested probability distribution for a second stage of nesting can be used to create at least one more level of conditional testing.

15. A computer program product to provide multiple probability distributions for an input simulation variable or an input simulation event based on at least one pre-defined, mutually exclusive condition being used by the input variable or the input simulation event, wherein the input variable or the input simulation event are associated with a design of a probabilistic setup, the computer program product comprising:
   one or more computer-readable tangible storage medium and program instructions stored on at least one of the one or more tangible storage medium, the program instructions executable by a processor, the program instructions comprising:
   program instructions to receive at least one pre-defined condition associated with the input variable or the input simulation event;
   program instructions to determine if the at least one pre-defined condition is a mutually exclusive condition entered by a user;
   program instructions to determine if a plurality of distributions associated with the at least one pre-defined condition is to be assigned from a plurality of existing data based on the at least one pre-defined condition being mutually exclusive;
   program instructions to select at least one required variable based on the determining that the plurality of distributions associated with the at least one pre-defined condition is to be assigned from the plurality of existing data;
   program instructions to assign the plurality of distributions using a plurality of required, default settings based on the selected at least one variable;
   program instructions to populate a plurality of required fields, wherein the plurality of required fields include a plurality of names and a plurality of parameters associated with the plurality of assigned distributions; and
   program instructions to prompt the user to edit or enter at least one required distribution name from the plurality of assigned distributions.

16. The computer program product of claim 15, further comprising:

program instructions to prompt the user to select at least one parent probability distribution from the plurality of distributions, wherein the selected at least one parent probability distribution is associated with a first stage of nesting;

program instructions to simulate a plurality of outcome values based on the selected at least one parent probability distribution associated with the first stage of nesting;

program instructions to formulate at least one mutually exclusive event criteria associated with a second stage of nesting, wherein the at least one mutually exclusive event criteria is formulated based on the simulated plurality of outcome values;

program instructions to determine at least one nested probability distribution for the second stage of nesting based on the formulated at least one mutually exclusive event criteria; and program instructions to select the at least one determined nested probability distribution for the second stage of nesting.

17. The computer program product of claim 15, wherein the plurality of parameters associated with the plurality of assigned distributions can be customized by the user.

18. The computer program product of claim 16, wherein the formulated at least one mutually exclusive event criteria associated with the second stage of nesting will determine a probability distribution to be selected in at least one next lower level nested stage.

19. The computer program product of claim 16, wherein the selected at least one parent probability distribution is customizable.

20. The computer program product of claim 16, wherein the simulated plurality of outcome values comprise of at least one cumulative probability or at least one absolute probability.

* * * * *